(12) United States Patent
Reber et al.

(10) Patent No.: US 9,082,824 B2
(45) Date of Patent: Jul. 14, 2015

(54) METHOD FOR FORMING AN ELECTRICAL CONNECTION BETWEEN METAL LAYERS

(71) Applicants: Douglas M. Reber, Austin, TX (US); Mehul D. Shroff, Austin, TX (US); Edward O. Travis, Austin, TX (US)

(72) Inventors: Douglas M. Reber, Austin, TX (US); Mehul D. Shroff, Austin, TX (US); Edward O. Travis, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 13/907,119

(22) Filed: May 31, 2013

(65) Prior Publication Data

US 2014/0353841 A1    Dec. 4, 2014

(51) Int. Cl.
*H01L 21/768*    (2006.01)
*H01L 23/48*     (2006.01)
*H01L 45/00*     (2006.01)

(52) U.S. Cl.
CPC .... *H01L 21/76877* (2013.01); *H01L 21/76802* (2013.01); *H01L 21/76895* (2013.01); *H01L 23/481* (2013.01); *H01L 45/1683* (2013.01)

(58) Field of Classification Search
CPC .............. H01L 21/28026; H01L 21/28; H01L 21/76807; H01L 21/76859; H01L 45/1683; H01L 2221/1015

USPC ........................... 257/774; 438/623, 624, 633
See application file for complete search history.

(56) References Cited

U.S. PATENT DOCUMENTS

| 6,500,749 | B1 * | 12/2002 | Liu et al. ........................ 438/618 |
| 6,579,795 | B1   | 6/2003  | Hau-Riege |
| 6,884,720 | B1 * | 4/2005  | Lu et al. ......................... 438/687 |
| 7,863,194 | B2   | 1/2011  | Yin et al. |
| 2005/0191411 | A1 * | 9/2005 | Jan ................................... 427/58 |
| 2006/0286797 | A1 * | 12/2006 | Zhang et al. .................. 438/659 |
| 2011/0124189 | A1 * | 5/2011 | Lehr et al. ..................... 438/627 |

\* cited by examiner

*Primary Examiner* — Peniel M Gumedzoe

(57) ABSTRACT

A method of making a semiconductor device having a substrate includes forming a first interconnect layer over the substrate, wherein a first metal portion of a first metal type is within the first interconnect layer and has a first via interface location. An interlayer dielectric is formed over the first interconnect layer. An opening in the interlayer dielectric is formed over the via interface location of the first metal portion. A second interconnect layer is formed over the interlayer dielectric. A second metal portion and a via of the first metal type is within the second interconnect layer. The via is formed in the opening to form an electrical contact between the first metal portion and the second metal portion. The via is over the first via interface location. A first implant of the first metal type is aligned to the first via interface location.

9 Claims, 10 Drawing Sheets

METHOD FOR FORMING AN ELECTRICAL CONNECTION BETWEEN METAL LAYERS

BACKGROUND

1. Field

This disclosure relates generally to semiconductor processing, and more specifically, to a method for forming an electrical connection between metal layers.

2. Related Art

Conductive vias provide electrical connections between metal lines of an integrated circuit. However, stress migration may result in via failures over time within the integrated circuit. For example, during operation of the integrated circuit, stress migration can cause the accumulation of vacancies within or at a conductive via, which results in the formation of voids which increase the resistance of the conductive via over time. Eventually, the increased resistance due to the vacancies may cause circuit failure. Stress migration may therefore affect long-term operation and reliability of the integrated circuit. The driving force for the migration of vacancies to the via site is the stress gradient. Due to the discontinuity in the metal lines caused by the vias, the stress at the vias is less tensile than in the metal lines to which the vias are connected.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As discussed above, stress migration can cause a via failure over time. Therefore, one embodiment of the present disclosure uses a metal implant into locations of the metal conductors where conductive vias are located or will be located. For example, the metal implants may be performed into regions of a metal conductor above or below a via interface. These metal atoms create a localized excess density of metal atoms. This makes these implanted regions more compressive, thus further reducing the tensile stress. However, even though reducing the tensile stress increases the driving force for void coalescence, the excess concentration of copper atoms will allow the metal to diffuse out and annihilate the incoming vacancies, thus preventing them from affecting the via. This metal implant may be performed at various times during processing, thus resulting in one or more implanted regions which may each help in reducing void formation.

Figure 1:
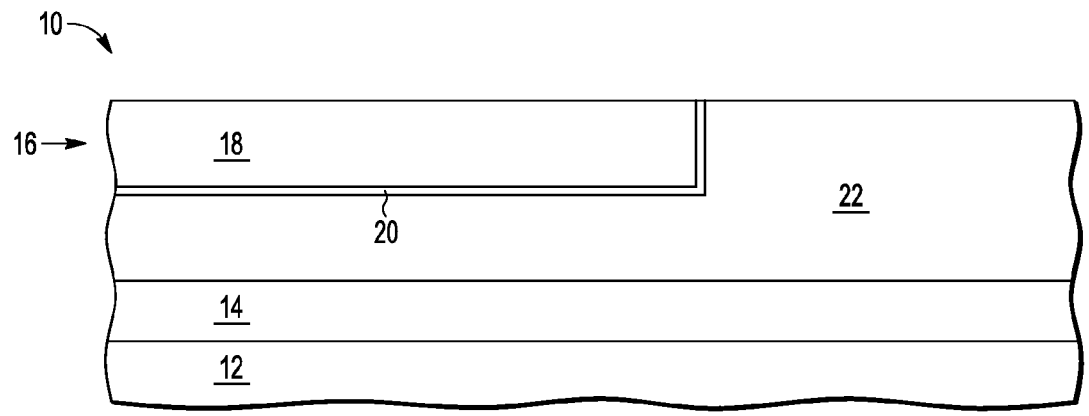
FIG. 1 illustrates a cross sectional view of a semiconductor device at a stage in processing, in accordance with an embodiment of the present disclosure.

FIG. 1 illustrates a cross sectional view of a semiconductor device 10. Device 10 includes a substrate 12, active circuitry 14 formed on and within substrate 12, and one or more interconnect layers over active circuitry 14. Substrate 12 may be any type of substrate, such as a semiconductor-on-insulator (SOI) substrate or bulk substrate, which includes any semiconductor material, such as silicon, germanium, or combinations thereof. Active circuitry 14 may include any type of circuitry including any number and type of transistors and/or other circuit elements. Interconnect layer 16 is formed over active circuitry 14. Interconnect layer 16 includes a metal portion 18 formed in an upper portion of interlayer dielectric layer (ILD) 22. Device 10 also includes a barrier layer 20 between metal portion 18 and ILD 22. Note that device 10 may include any number of interconnect layers between interconnect layer 16 and active circuitry 14. The interconnect layers route electrical connections of device 10. Each interconnect layer, such as interconnect layer 16, includes any number of metal portions, such as metal portion 18, which may be used to route signals within the interconnect layer, and any number of conductive vias (not illustrated in the cross section of FIG. 1), which route signals between metal portions of different interconnect layers. The metal portions, such as metal portion 18, may also be referred to as metal lines.

Figure 2:
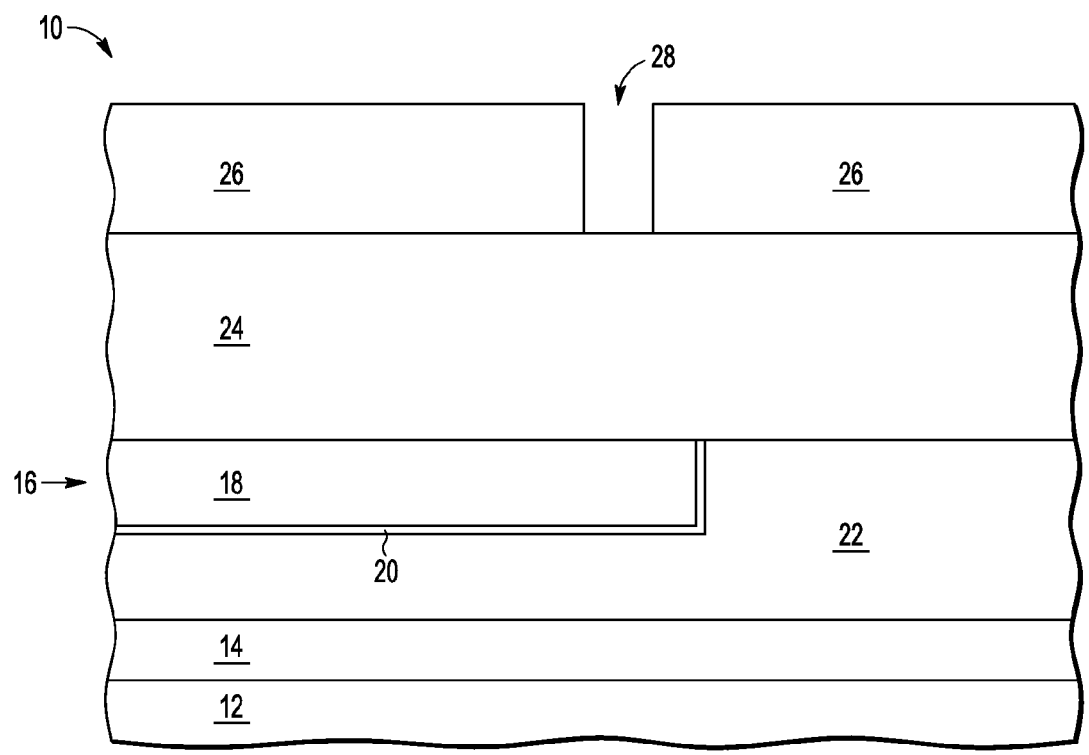
FIG. 2 illustrates a cross sectional view of the semiconductor device of FIG. 1 in a subsequent stage in processing, in accordance with an embodiment of the present disclosure.

FIG. 2 illustrates a cross section of semiconductor device 10 after formation of an interlayer dielectric layer (ILD) 24 over interconnect layer 16, and a patterned masking layer 26 over ILD 24 which includes an opening 28. Any of the interlayer dielectric layers (ILDs) described herein may be formed of one or more layers of dielectric materials. Opening 28 defines a location of a via opening. In one embodiment, patterned masking layer 26 is a photo-resist layer.

Figure 3:
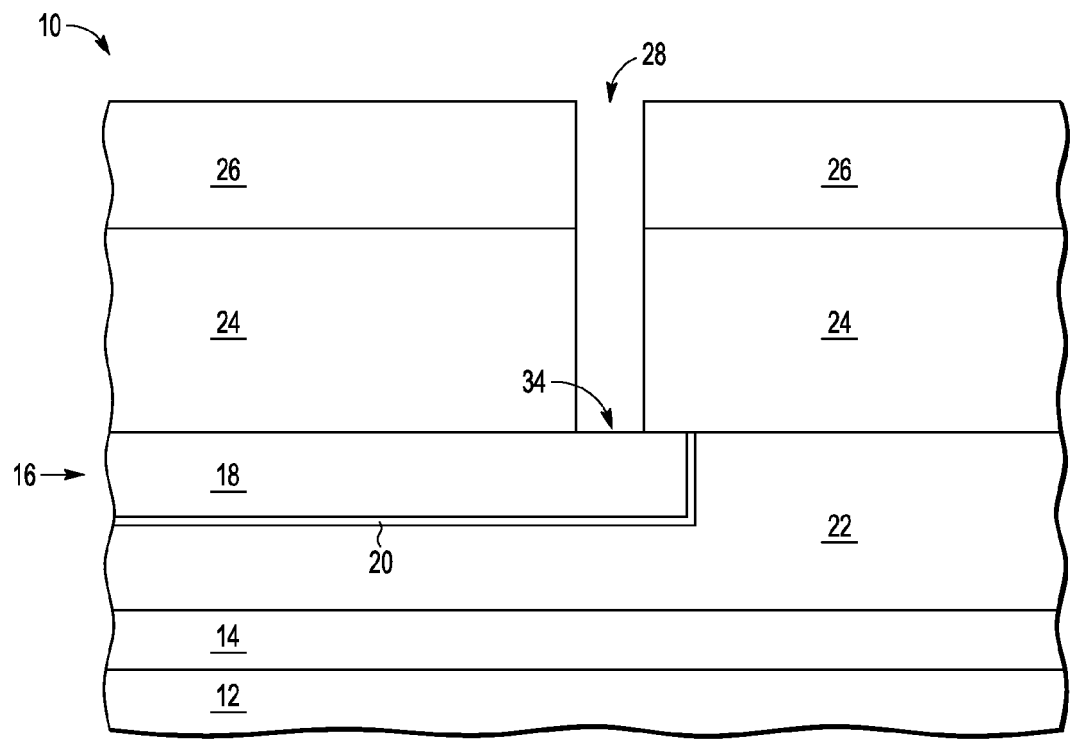
FIG. 3 illustrates a cross sectional view of the semiconductor device of FIG. 2 in a subsequent stage in processing, in accordance with an embodiment of the present disclosure.

FIG. 3 illustrates a cross section of semiconductor device 10 in which opening 28 is extended through ILD 24 to expose underlying metal portion 18. Opening 28 exposes via interface 34 which corresponds to an interface between a via to be subsequently formed within opening 28 and metal portion 18. In an alternate embodiment, opening 28 may extend only part of the way through ILD 24 during this step, and may be further extended to via interface 34 during a subsequent step (e.g. such as in the step illustrated in FIG. 5 described below).

Figure 4:
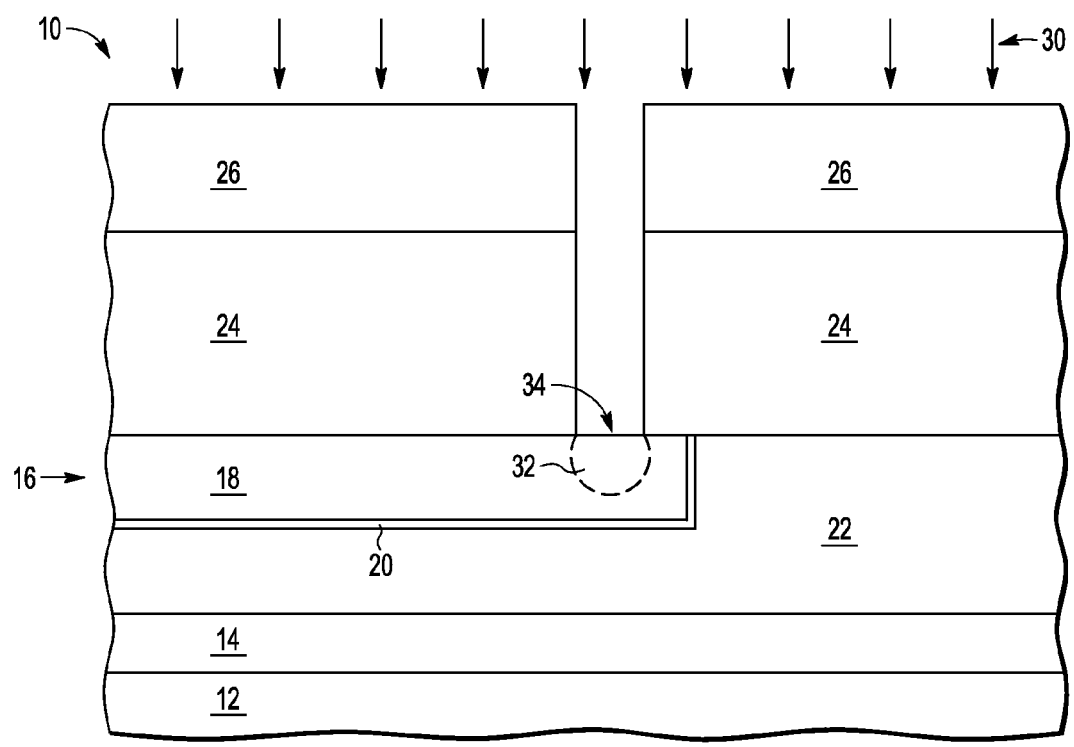
FIG. 4 illustrates a cross sectional view of the semiconductor device of FIG. 3 in a subsequent stage in processing, in accordance with an embodiment of the present disclosure.

FIG. 4 illustrates a cross section of semiconductor device 10 in which a metal implant 30 is performed to form an implanted region 32 in metal portion 18. Implant 30 is performed through opening 28 which was defined by patterned masking layer 26. Therefore, the same patterned masking layer used to define the via opening which exposes via interface 34 can be used to form implanted region 32 within metal portion 18 at via interface 34. In this manner, implanted region 32 is aligned to via interface 34. In one embodiment, metal portion 18 includes a metal type, such as for example copper, silver, or aluminum. Metal implant 30 is of the same metal type as metal portion 18. Therefore, if metal portion 18 is copper, then metal implant 30 is a copper implant in which implanted region 32 includes copper atoms. In one embodiment, the implant dosage of the implanted metal will be greater than $1 \times 10^{14}/cm^2$ but less than $5 \times 10^{16}/cm^2$. The implant energy may be 50 to 2000 keV. The implant dosage and energy determine the depth of implanted region 32. The implant depth is chosen such that the depth or range combined with the longitudinal straggle would not result in appreciable implanted metal below metal portion 18 in ILD 22.

Figure 5:
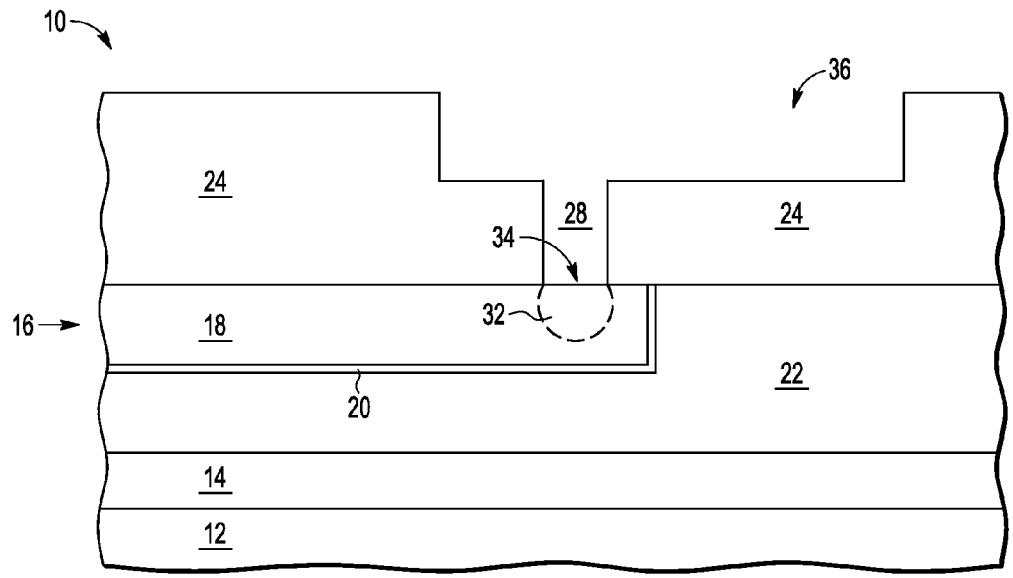
FIG. 5 illustrates a cross sectional view of the semiconductor device of FIG. 4 in a subsequent stage in processing, in accordance with an embodiment of the present disclosure.

FIG. 5 illustrates a cross section of semiconductor device 10 in which a trench 36 is formed in an upper portion of ILD 24. Trench 36 extends to opening 28. Also, in the embodiment in which opening 28 was not extended all the way to interface 34 in the step described above in reference to FIG. 2, opening 28 can be extended to via interface 34 prior to forming trench 36.

Figure 6:
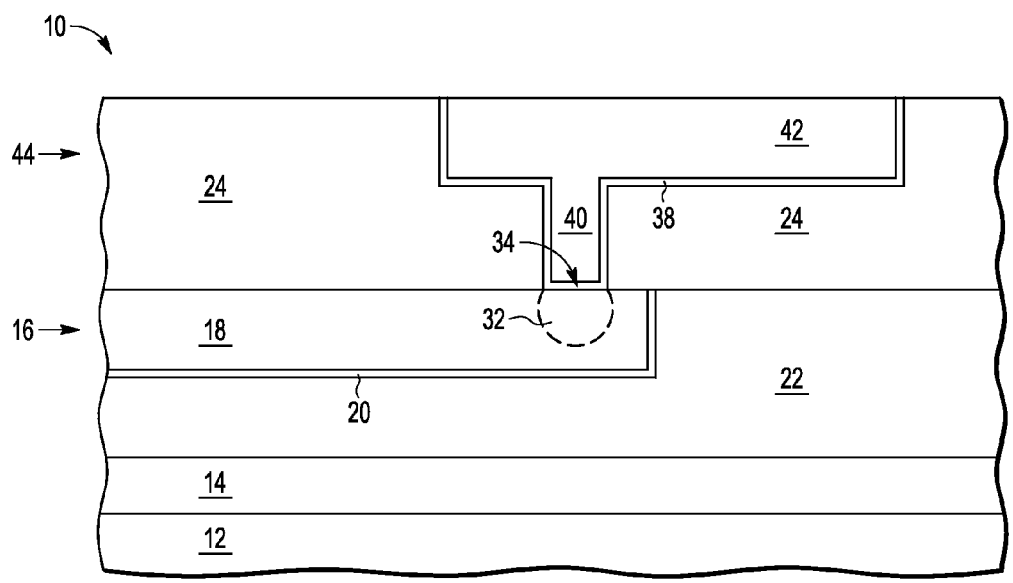
FIG. 6 illustrates a cross sectional view of the semiconductor device of FIG. 5 in a subsequent stage in processing, in accordance with an embodiment of the present disclosure.

FIG. 6 illustrates a cross section of semiconductor device 10 in which a barrier layer 38 is formed within via opening 28 and trench 36. In one embodiment, barrier layer 38 is blanket deposited over ILD 24 and within opening 28 and trench 36. After formation of barrier layer 38, opening 28 and trench 36 is filled with a metal to form a metal portion 42 within trench 36 and a conductive via 40 within opening 28. In one embodiment (such as in the case of metal portions 40 and 42 being copper), formation of metal portions 40 and 42 may be done by first depositing a seed layer on barrier layer 38, followed by electroplating additional metal over the seed layer. In this manner, interconnect layer 44 is formed over interconnect layer 16, in which interconnect layer 44 may include any number of metal lines or metal portions, such as metal portion 42, and any number of vias, such as via 40. Via 40 forms an electrical contact between metal portion 42 and metal portion 18. After filling opening 28 and trench 36 with metal, a chemical mechanical polish (CMP) may be performed in which portions of the metal (as well as portions of barrier layer 38) which extend over ILD 24 may be removed. In one embodiment, metal portion 42 and via 40 are of the same metal type as metal portion 18. Therefore, in one embodiment, metal portion 18, via 40, and metal portion 42 all include copper.

Figure 7:
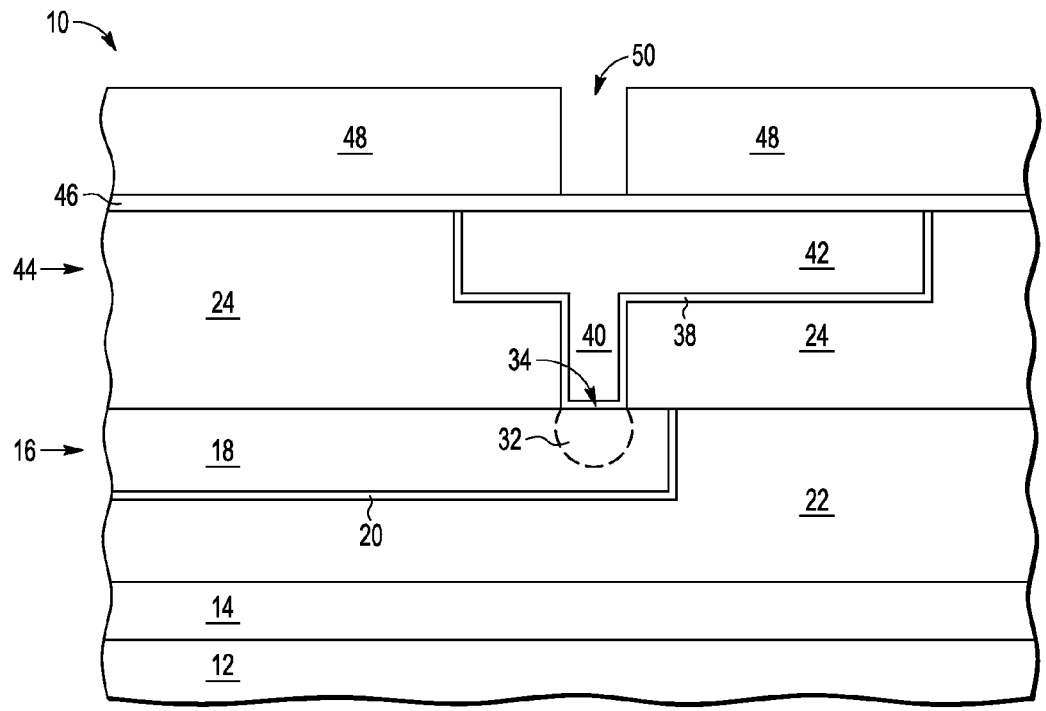
FIG. 7 illustrates a cross sectional view of the semiconductor device of FIG. 6 in a subsequent stage in processing, in accordance with an embodiment of the present disclosure.

FIG. 7 illustrates a cross section of semiconductor device 10 in which a dielectric layer 46 is formed over interconnect layer 44 and ILD 24. In one embodiment, dielectric layer 46 is formed by blanket depositing an oxide over interconnect layer 44 and ILD 24. A patterned masking layer 48 is formed over dielectric layer 46. Patterned masking layer 48 includes an opening 50 which is aligned to via 40. In one embodiment, patterned masking layer 48 is a photo-resist layer. Opening 50 exposes dielectric layer 46 and is aligned with a via interface 51 between metal portion 42 and a via which may subsequently be formed over metal portion 42 and which may electrically contact metal portion 42 at via interface 51.

Figure 8:
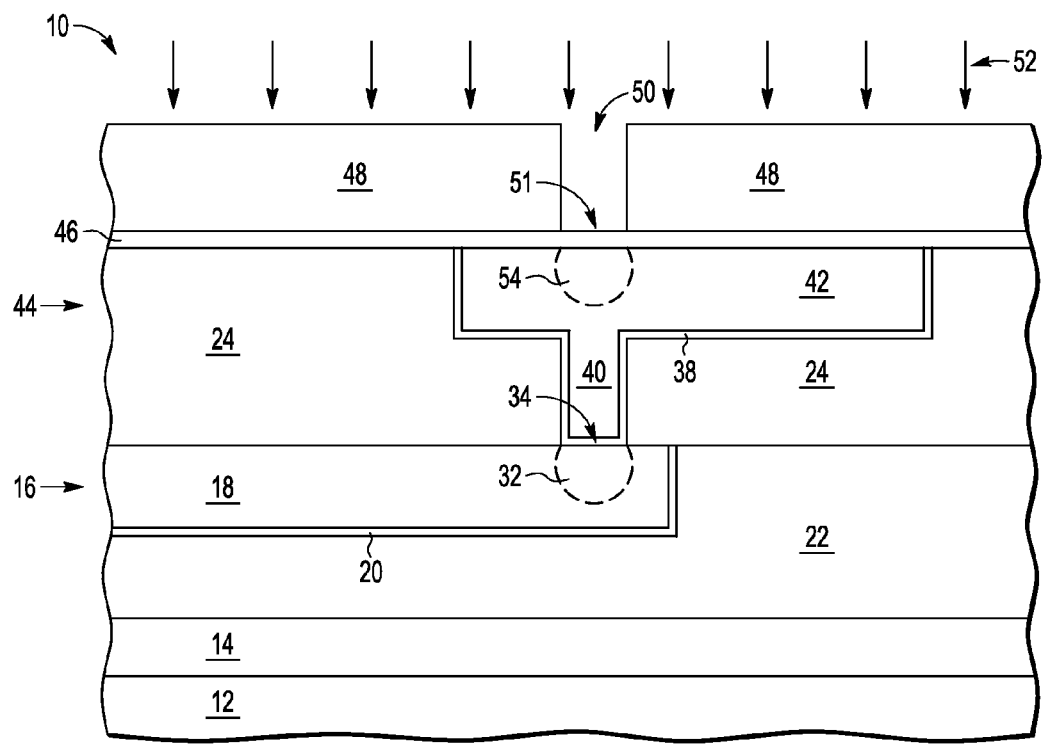
FIG. 8 illustrates a cross sectional view of the semiconductor device of FIG. 7 in a subsequent stage in processing, in accordance with an embodiment of the present disclosure.

FIG. 8 illustrates a cross section of semiconductor device 10 in which a metal implant 52 is performed to form an implanted region 54 in metal portion 42. Implant 52 is performed through opening 50 which exposes via interface 51. In this manner, implanted region 54 is aligned to via interface 51. In one embodiment, metal portion 42 includes a metal type, such as for example copper, silver, or aluminum. Metal implant 52 is of the same metal type as metal portion 42. Therefore, if metal portion 42 is copper, then metal implant 52 is a copper implant in which implanted region 54 includes copper atoms.

Figure 9:
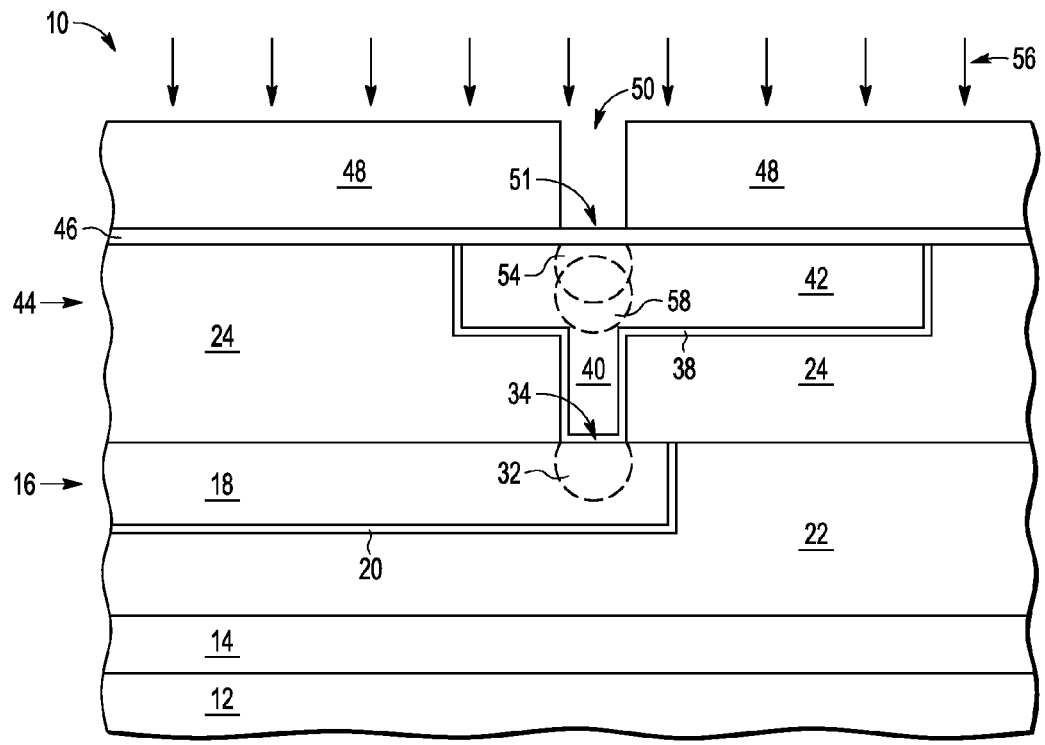
FIG. 9 illustrates a cross sectional view of the semiconductor device of FIG. 8 in a subsequent stage in processing, in accordance with an embodiment of the present disclosure.

FIG. 9 illustrates a cross section of semiconductor device 10 in which a metal implant 56 is performed to form an implanted region 58 in metal portion 42. Implant 56 is performed through opening 50 which exposes via interface 51. In this manner, implanted region 58 is aligned to via interface 51. Also, metal implant 56 is of the same metal type as metal portion 42. In one embodiment, metal implant 56 is performed by plasma immersion ion implantation. Note that the dosage of the implant and the energy may be modified between implants 52 and 56 to result in different locations of implanted regions 54 and 58. For example, a higher energy may be used for implant 56 than for implant 52 such that implanted region 54 is formed closer to via interface 51 while implanted region 58 is formed closer to via 40. In one embodiment, each of implants 56 and 52 use an implant dosage of greater than $1 \times 10^{14}/cm^2$ but less than $5 \times 10^{16}/cm^2$. The implant energy may be 50 to 3000 keV for implant 52 and 50 to 3000 keV for implant 56. The implant dosage and energy determine the locations (e.g. depths) of implanted regions 54 and 58. Also, note that implanted regions 54 and 58 may be formed in any order. That is, implanted region 58 may be formed prior to implanted region 54.

Figure 10:
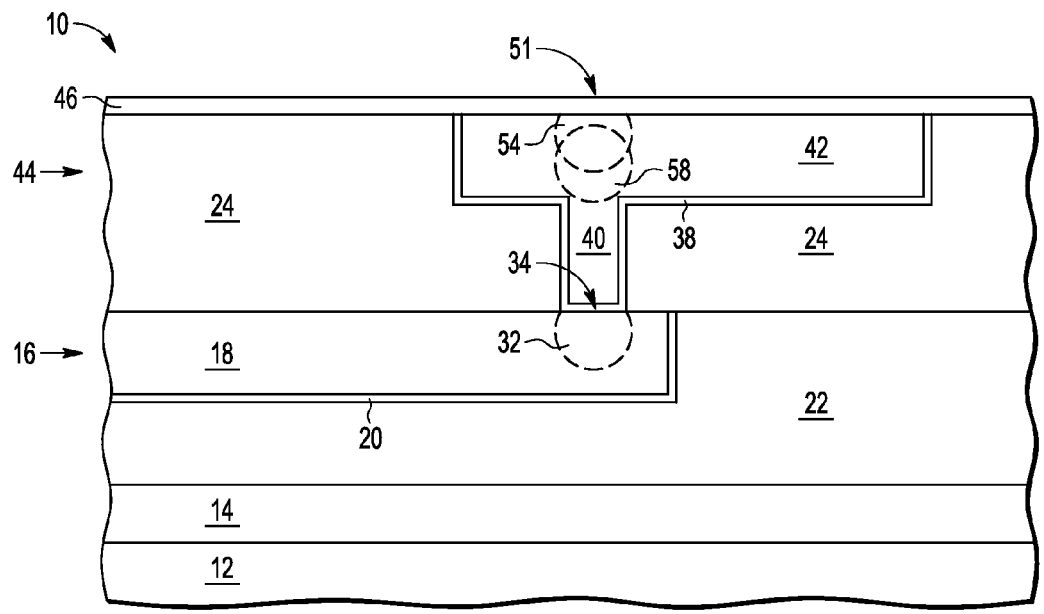
FIG. 10 illustrates a cross sectional view of the semiconductor device of FIG. 9 in a subsequent stage in processing, in accordance with an embodiment of the present disclosure.

FIG. 10 illustrates a cross section of semiconductor device 10 after removal of patterned masking layer 48. In one embodiment, each of implanted regions 32, 54, and 58 is formed, as described above. However, in alternate embodiments, only one or more of regions 32, 54, and 58 may be formed. Each of these regions of metal atoms helps reduce void formation by vacancies. Vacancies refer to vacant lattice sites or grain boundary discontinuities in the metal layer, such as in metal portions 42 and 18, which may form as a result of the processing steps used to form structure 10. Therefore, voids may be formed at via interface 34 due to the migration of vacancies from metal portion 18 and/or from vacancies which come down from metal portion 42. Similarly, voids may be formed at via interface 51 due to the migrations of vacancies from metal portion 42 or metal portions of a subsequently formed metal layer. In the example in which metal portion 42 and metal portion 18 are copper, and implanted regions 32, 54, and 58 are formed with a copper implant, each of implanted regions 32, 54, and 58 has excess copper compared to the as-formed interconnect metal (e.g. metal portions 42 and 18 and via 40 without, or prior to, any metal implantation) which makes these regions more compressive. However, although tensile stress is decreased, which may increase the migration of voids to via interfaces 34 and 51, the excess copper atoms in these regions will allow copper to diffuse out and consume incoming vacancies. Therefore, although tensile stress away from the via may still be high, each of regions 32, 54, and 58 may operate to reduce void formation at the via interfaces.

In the illustrated embodiments of FIGS. 1-10, a via first/trench last formation of metal portion 42 and via 40 was described. In an alternate embodiment, a trench first/via last process may be used. In this embodiment, a patterned masking layer may be used to form trench opening 36 prior to forming via opening 28. After fully or partially forming trench opening 36 in a top portion of ILD 24, a patterned masking layer, similar to patterned masking layer 26, may be formed to define an opening 28 within trench 36. Opening 28 may then be formed, extending from trench 36 through ILD 24 to interface 34. Implant 30 may be performed at this point, using the same patterned masking layer which defined the via opening. If trench 36 was only partially created, it can be completed during formation of opening 28.

Figure 11:
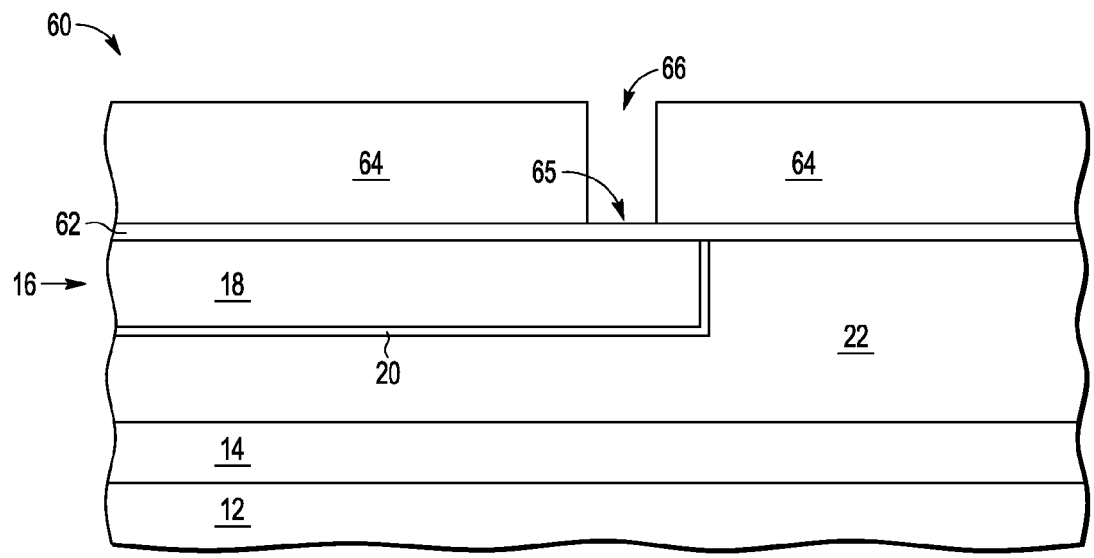
FIG. 11 illustrates a cross sectional view of a semiconductor device at a stage in processing, in accordance with an embodiment of the present disclosure.

FIG. 11 illustrates a cross section of a semiconductor device 60 in accordance with an embodiment, in which like reference numbers indicate like elements. Therefore, in FIG. 11, after formation of interconnect layer 16, as was described above, a dielectric layer 62 is formed over interconnect layer 16 and ILD 22. In one embodiment, dielectric layer 62 is formed by blanket depositing an oxide layer. A patterned masking layer 64 is formed over dielectric layer 62. In one embodiment, patterned masking layer 64 is photo-resist. Patterned masking layer 64 has an opening 66 which exposes dielectric layer 62 and is aligned with a via interface 65 between metal portion 18 and a via which will subsequently be formed over metal portion 18 which may electrically contact metal portion 18 at via interface 65.

Figure 12:
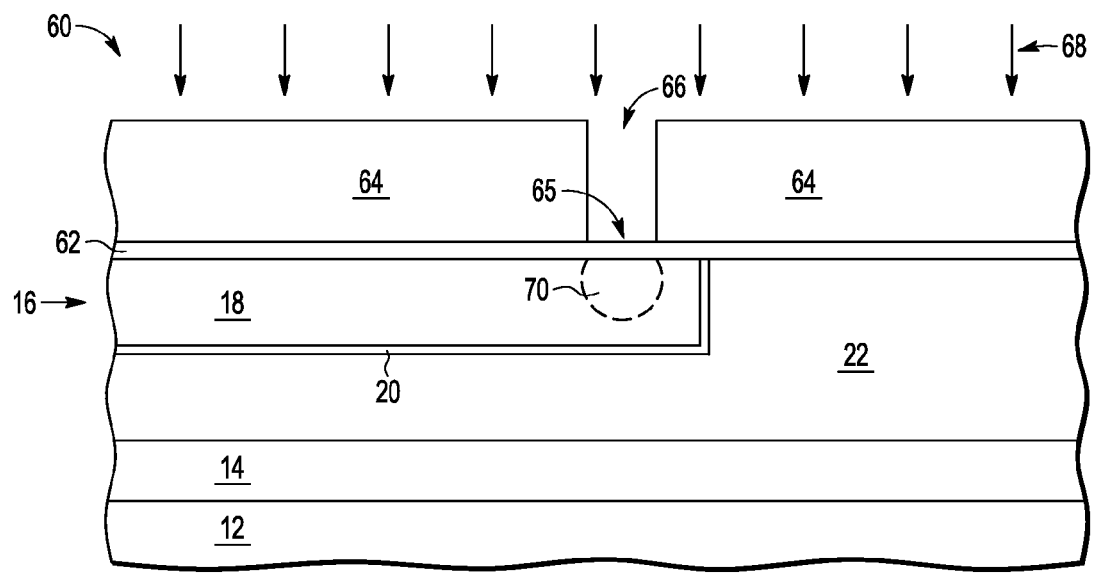
FIG. 12 illustrates a cross sectional view of the semiconductor device of FIG. 11 in a subsequent stage in processing, in accordance with an embodiment of the present disclosure.

FIG. 12 illustrates a cross section of semiconductor device 60 in which a metal implant 68 is performed to form an implanted region 70 in metal portion 18. Implant 68 is performed through opening 66 which exposes via interface 65. In this manner, implanted region 70 is aligned to via interface 65. Also, metal implant 68 is of the same metal type as metal portion 18. In one embodiment, implant 68 uses an implant dosage of greater than $1 \times 10^{14}/cm^2$ but less than $5 \times 10^{16}/cm^2$. The implant energy may be 50 to 2000 keV. The implant dosage and energy determine the depth of implanted region 70.

Figure 13:
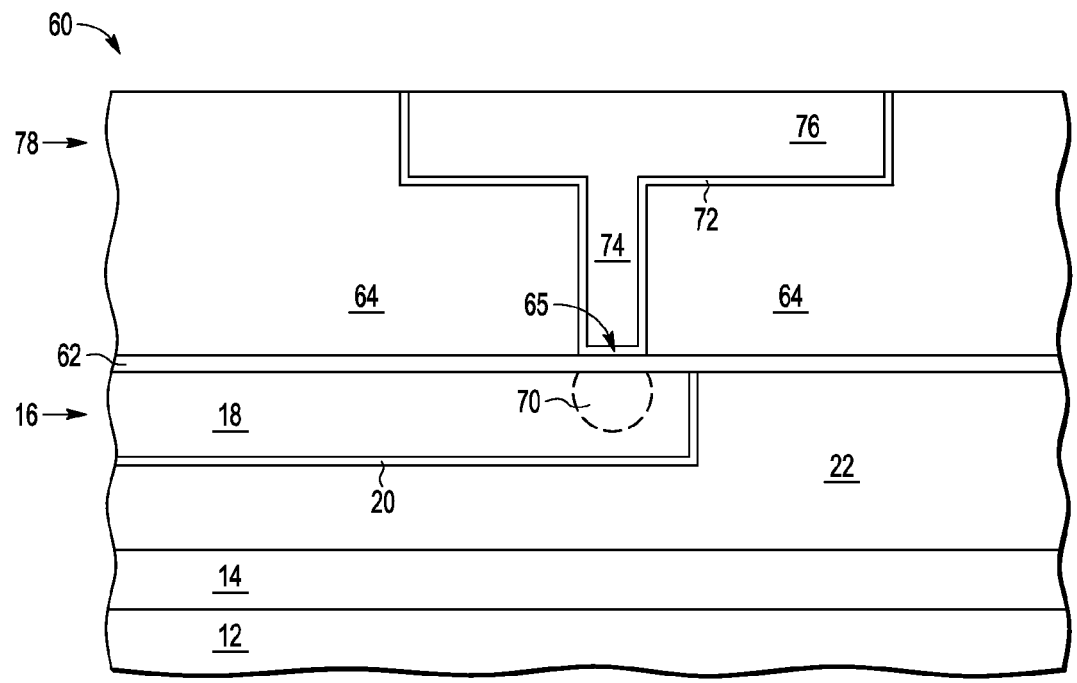
FIG. 13 illustrates a cross sectional view of the semiconductor device of FIG. 12 in a subsequent stage in processing, in accordance with an embodiment of the present disclosure.

FIG. 13 illustrates a cross section of semiconductor device 60 in which a patterned masking layer 64 is removed and an interconnect layer 78 is formed over interconnect layer 16 and ILD 22. In one embodiment, an interlayer dielectric layer 64 is formed over dielectric layer 62, and a via opening is formed through ILD 64 to expose via interface 65. A trench is formed in an upper portion of ILD 64 which extends to the via opening. A barrier layer 72 is formed in the via opening and trench. The trench and via opening are then filled with a metal to form via 74 and metal portion 76 of interconnect layer 78. After filling the trench and via opening with metal, a CMP may be performed to remove portions of the metal and of barrier layer 72 which were formed over ILD 64.

Figure 14:
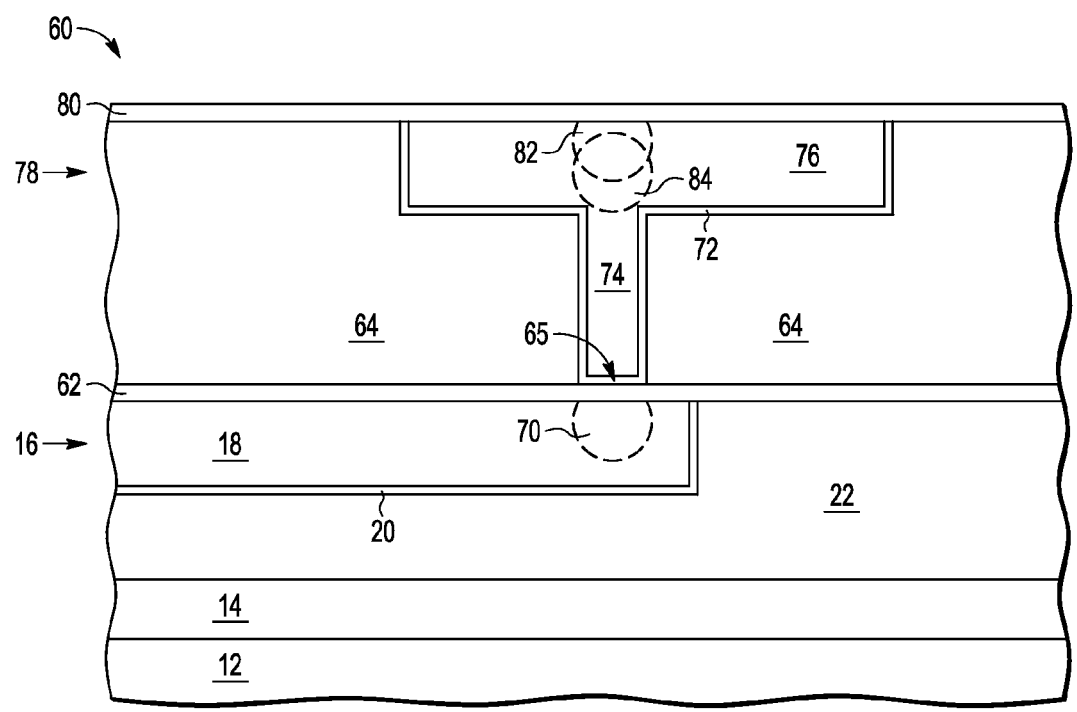
FIG. 14 illustrates a cross sectional view of the semiconductor device of FIG. 13 in a subsequent stage in processing, in accordance with an embodiment of the present disclosure.

FIG. 14 illustrates a cross section of semiconductor device 60 in which a dielectric layer 80 is formed over interconnect layer 78. Implanted regions 82 and 84 may then be formed in metal portion 76 and via 74. Implanted regions may be formed in a manner analogous to how implanted regions 54 and 58 were formed. For example, a patterned masking layer may be formed having an opening through which metal implants can be performed. Each metal implant results in an implanted regions, such as region 82 and 84. The implants are performed using the same metal type as in metal portion 76 and via 74, and by varying their dosage and/or energy, implanted regions 82 and 84 will have different locations (e.g. depths) in metal portion 76. Also, note that implanted regions 82 and 84 may be formed in any order. That is, implanted region 82 may be formed after or prior to implanted region 84. In one embodiment, each of implanted regions 70, 82, and 84 is formed, as described above. However, in alternate embodiments, only one or more of regions 70, 82, and 84 may be formed. Each of these regions of metal atoms helps reduce void formation by vacancies as was described above in reference to each of regions 32, 54, and 58. Therefore, although tensile stress may be decreased, each of regions 70, 82, and 84 may operate to reduce void formation at the via interfaces.

Figure 15:
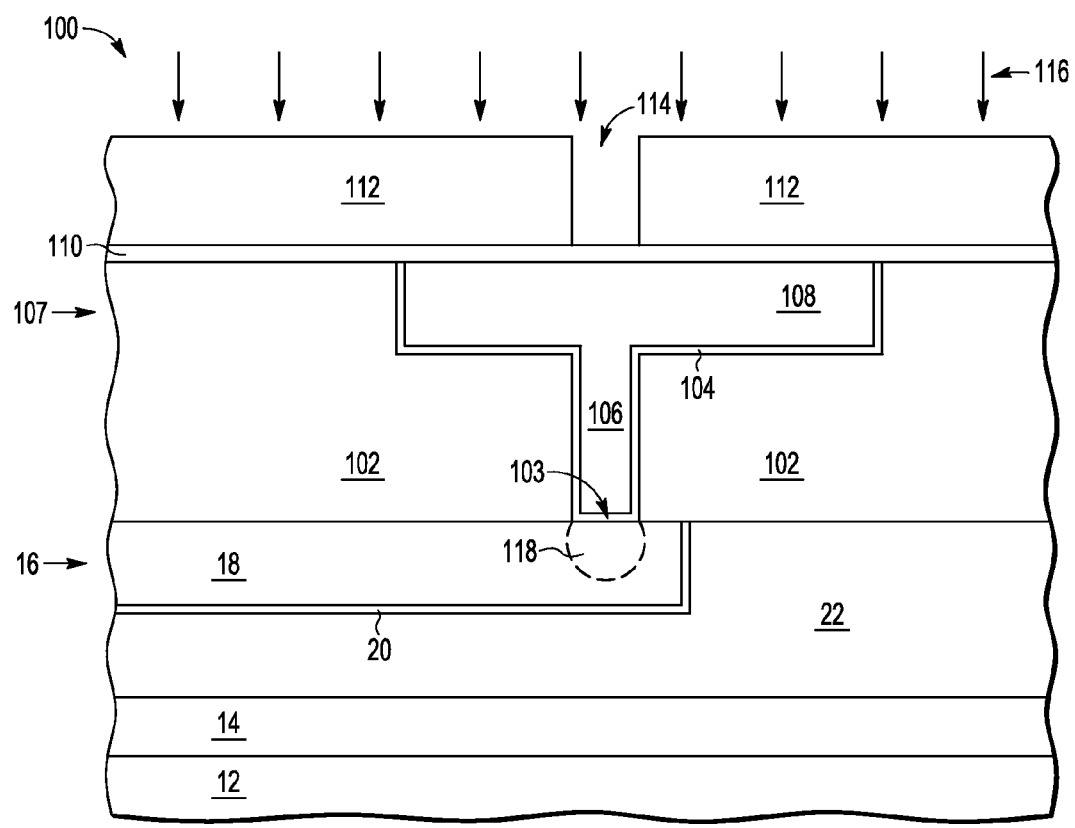
FIG. 15 illustrates a cross sectional view of a semiconductor device at a stage in processing, in accordance with an embodiment of the present disclosure.

FIG. 15 illustrates a cross section of a semiconductor device 100 in accordance with an embodiment, in which like reference numbers indicate like elements. Therefore, in FIG. 15, after formation of interconnect layer 16, as was described above, an interconnect layer 107 is formed over interconnect layer 16. In one embodiment, an interlayer dielectric layer 102 is formed over metal portion 18 and ILD 22, and a via opening is formed through ILD 102 to expose metal portion 18. A trench is formed in an upper portion of ILD 102 which extends to the via opening. A barrier layer 104 is formed in the via opening and trench. The trench and via opening are then filled with a metal to form via 106 and metal portion 108 of interconnect layer 107. After filling the trench and via opening with metal, a CMP may be performed to remove portions of the metal and of barrier layer 104 which were formed over ILD 102. Via 106 electrically contacts metal portion 18 at via interface 103. After formation of interconnect layer 107, a dielectric layer 110 is formed over interconnect layer 107 and ILD 102. In one embodiment, dielectric layer 110 is formed by blanket depositing an oxide layer. A patterned masking layer 112 is formed over dielectric layer 110. In one embodiment, patterned masking layer 112 is photo-resist. Patterned masking layer 112 has an opening 114 which exposes dielectric layer 110 and is aligned with a via interface 103. After formation of opening 114 in patterned masking layer 112, a metal implant 116 is performed through opening 114 to form an implanted region 118 in metal portion 18. Therefore, implant 116 travels through metal portion 108 and via 106 forms implanted region 118. Since opening 114 is aligned with is via interface 103, implanted region 118 is also aligned to via interface 103. Also, metal implant 116 is of the same metal type as metal portion 18. In one embodiment, implant 116 uses an implant dosage of greater than $1 \times 10^{14}/cm^2$ but less than $5 \times 10^{16}/cm^2$. The implant energy may be 50 to 3000 keV. The implant dosage and energy determine the depth of implanted region 118, and has to be sufficient to allow implanted region 118 to be formed at via interface 103.

Figure 16:
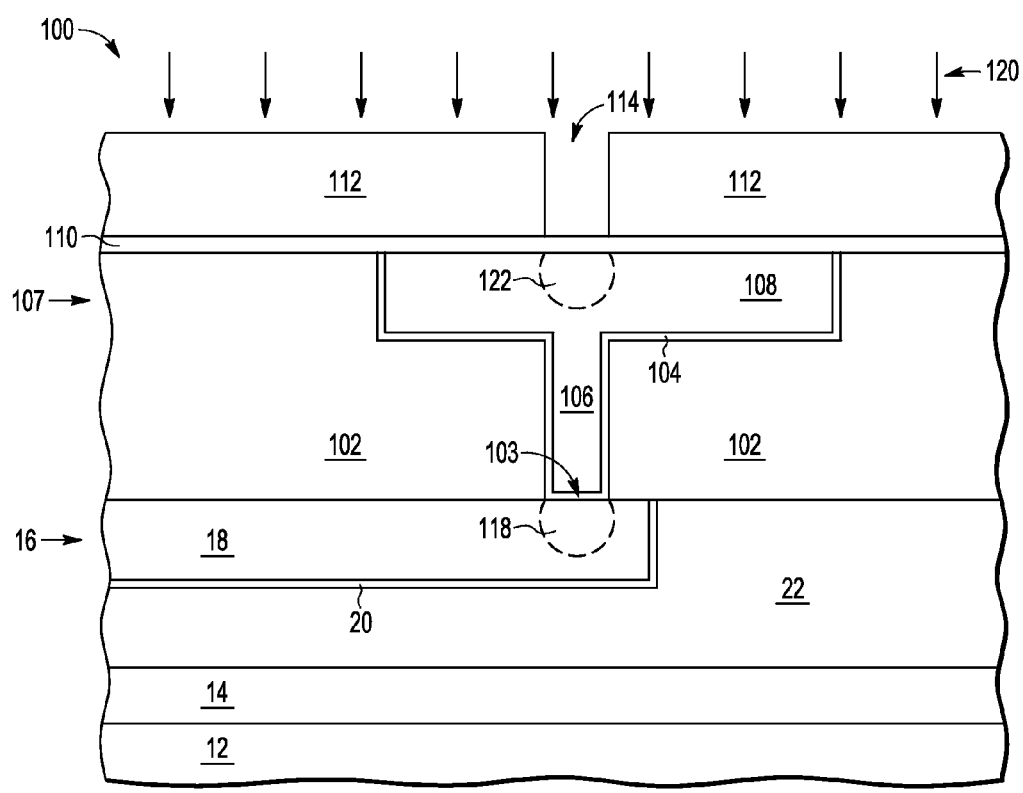
FIG. 16 illustrates a cross sectional view of the semiconductor device of FIG. 15 in a subsequent stage in processing, in accordance with an embodiment of the present disclosure.
Figure 17:
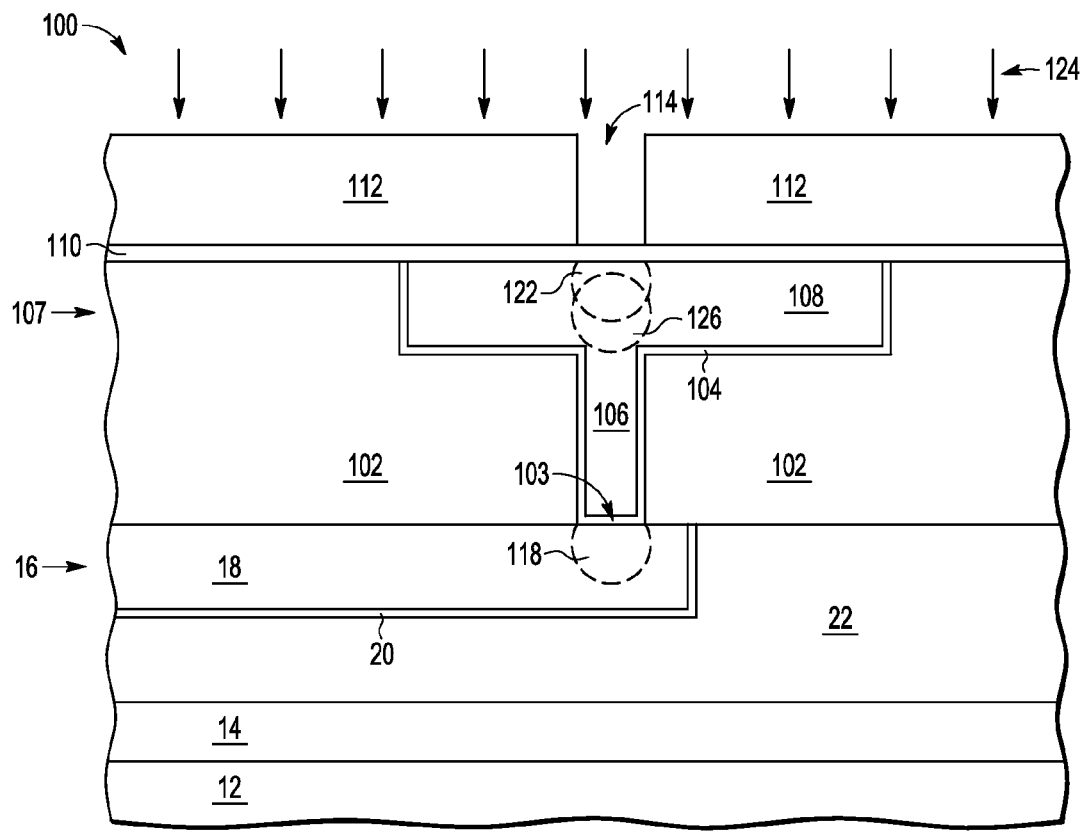
FIG. 17 illustrates a cross sectional view of the semiconductor device of FIG. 16 in a subsequent stage in processing, in accordance with an embodiment of the present disclosure.

FIG. 16 illustrates a cross section of semiconductor device 100 in which a metal implant 120 is performed through opening 114 to form an implanted region 122 in metal portion 108. FIG. 17 illustrates a cross section of semiconductor device 100 in which a metal implant 124 is performed through opening 114 to form an implanted region 126 in metal portion 108 and via 106. Each of implants 120 and 124 may be of the same metal type as metal portion 108 and via 106. Implanted regions 122 and 126 may be formed in a manner analogous to how implanted regions 52 and 54 were formed.

Therefore, each of implants 116, 120, and 124 are formed using the same patterned masking layer in which opening 114 ensures that each of the implanted regions are all aligned to via interface 103. Furthermore, by varying their dosage and/or energy, each of the implanted regions will have different locations (e.g. depths). For example, implant 116 may use a greater energy than implant 120 or implant 124 because it has to reach metal portion 18 which is below via 106. Also, note that implants 116, 120, and 124 may be performed in any order.

In one embodiment, each of implanted regions 122, 126, and 118 is formed, as described above. However, in alternate embodiments, only one or more of regions 122, 126, and 118 may be formed. Each of these regions of metal atoms helps reduce void formation by vacancies as was described above in reference to each of regions 32, 54, and 58. Therefore, although tensile stress may be still be high away from the via, each of regions 122, 126, and 118 may operate to reduce void formation at the via interfaces.

Figure 18:
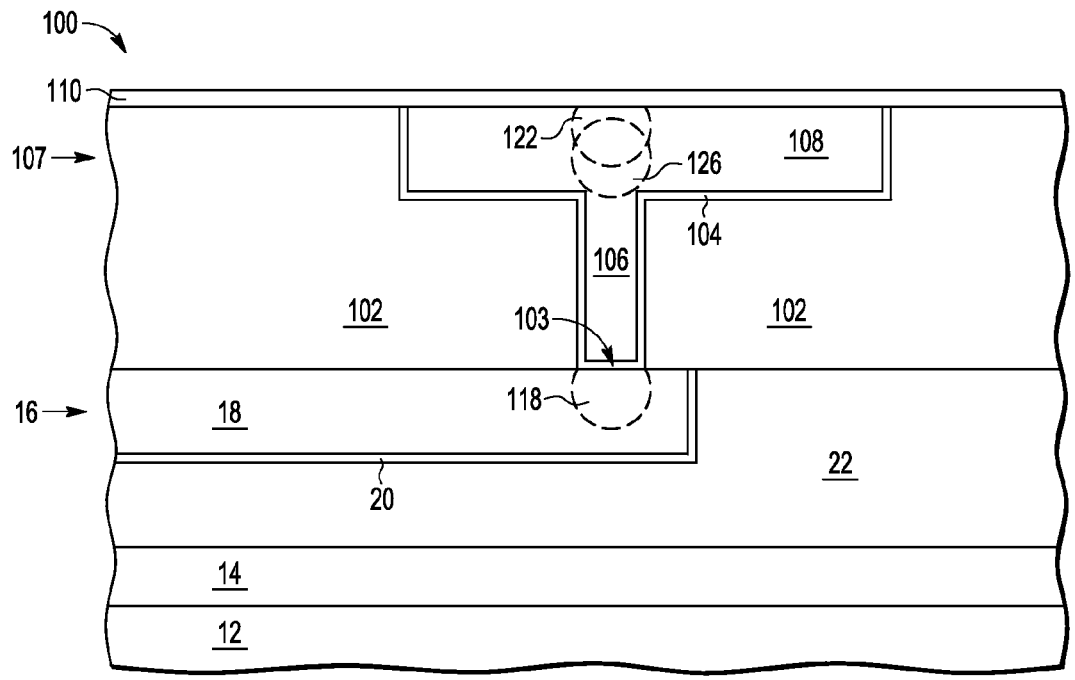
FIG. 18 illustrates a cross sectional view of the semiconductor device of FIG. 17 in a subsequent stage in processing, in accordance with an embodiment of the present disclosure.

FIG. 18 illustrates a cross section of semiconductor device 100 in which patterned masking layer 112 has been removed.

Note that the embodiments of FIGS. 11-14 and 15-18 were described in reference to a via first/trench last process. However, for any of the embodiments herein, a trench first/via last process may be used. Furthermore, partial-via or partial-trench formations, as were described in reference to FIGS. 1-10, may be used.

By now it should be appreciated that there has been provided a method for addressing stress migration and electromigration issues. A combination of one or more implanted regions may be formed in which there is an excess of metal atoms of the same type as the metal type in which they are formed. These excess metal atoms, while decreasing tensile stress, may act to reduce void formation at the via interfaces. The metal implants used to form these implanted regions in the metal portions and vias of the interconnect layer may be performed at various different stages in processing. With the creation of these one or more metal implanted regions, reliability and integrity of the vias and of the integrated circuit may be improved.

Although the invention is described herein with reference to specific embodiments, various modifications and changes can be made without departing from the scope of the present invention as set forth in the claims below. For example, the implanted regions can be formed in other or additional locations in the vicinity of via interfaces to help reduce void formation. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of making a semiconductor device having a substrate, including forming a first interconnect layer over the substrate, wherein a first metal portion of a first metal type is within the first interconnect layer and has a first via interface location; forming an interlayer dielectric over the first interconnect layer; forming an opening in the interlayer dielectric over the first via interface location of the first metal portion; forming a second interconnect layer over the interlayer dielectric, wherein a second metal portion and a via of the first metal type is within the second interconnect layer, the via is formed in the opening to form an electrical contact between the first metal portion and the second metal portion, and the via is over the first via interface location; and performing a first implant of the first metal type aligned to the first via interface location. Item 2 includes the method of item 1, wherein the first implant forms an implanted region in the first metal portion at an interface with the via. Item 3 includes the method of claim 2, wherein the performing the first implant occurs prior to forming the interlayer dielectric. Item 4 includes the method of item 2, wherein the performing the first implant occurs through the opening prior to completion of forming the second interconnect layer. Item 5 includes the method of item 2, wherein the performing the first implant occurs after forming the second interconnect layer. Item 6 includes the method of item 1, wherein the first implant forms an implanted region in the second metal portion at a top surface of the second metal portion. Item 7 includes the method of item 1, wherein the first implant forms an implanted region in the via and the second metal portion. Item 8 includes the method of item 1, wherein: the forming the second interconnect layer comprises forming a trench in the interlayer dielectric having a bottom surface; the forming the opening comprises forming an opening from the bottom surface of the trench to the first interconnect layer; the forming the via comprises filling the opening with copper; and the forming the second interconnect layer comprises filling the trench with copper. Item 9 includes the method of item 1, wherein the forming the second interconnect layer comprises forming a trench in the interlayer dielectric that extends to the opening and forming copper in the opening and the trench. Item 10 includes the method of item 1, wherein the forming the second interconnect layer comprises forming a trench in the interlayer dielectric that extends the opening to the first interconnect layer and filling the trench and the extended opening with copper. Item 11 includes the method of item 1, and further includes performing a second implant of the first metal type aligned to the first via interface location. Item 12 includes the method of item 11, wherein the first implant forms a first implanted region and the second implant forms a second implanted region, wherein the first implanted region is in the first metal portion and the second implanted region is in the second metal portion. Item 13 includes the method of item 11, wherein the first implant forms a first implanted region and the second implant forms a second implanted region, wherein the first implanted region is in the first metal portion and the second implanted region is in the via. Item 14 includes the method of item 11, wherein the first implant forms a first implanted region and the second implant forms a second implanted region, wherein the first implanted region is in the via and the second implanted region is in the second metal portion. Item 15 includes the method of item 14, and further includes performing a third implant of the first metal type aligned to the first via interface location, wherein the third implant forms a third implanted region, wherein the third implanted region is in the first metal portion.

Item 16 includes a method of making a semiconductor device having a substrate, including forming a first interconnect layer over the substrate, wherein a first metal portion of a first metal type is within the first interconnect layer and has a first via interface location; forming an interlayer dielectric over the first interconnect layer; forming an opening in the interlayer dielectric over the first via interface location of the first metal portion; forming a second interconnect layer over the interlayer dielectric, wherein a second metal portion and a via of the first metal type is within the second interconnect layer, the via is formed in the opening to form an electrical contact between the first metal portion and the second metal portion, the via is over the first via interface location, a second via interface location is in the second metal portion directly over the via; and performing a first implant of the first metal type in at least a portion of a via region, wherein the via region comprises the via, the first via interface location, and the second via interface location. Item 17 includes the method of item 16, wherein the performing the first implant is to reduce a risk of voiding in the via region due to vacancies in at least one of group consisting of the first metal portion and the second metal portion. Item 18 includes the method of item 17, wherein the first metal type is copper, further comprising a second implant of copper in the via region, wherein the first implant is aligned to the first via interface. Item 19 includes the method of item 18, wherein the second implant is in one of a group consisting of the via and the second via interface location.

Item 20 includes a semiconductor device having a first metal layer over a substrate; an interlayer dielectric over the first metal layer; an opening in the interlayer dielectric; a second metal layer over the interlayer dielectric; a via in the opening electrically connecting the first metal layer and the second metal layer; a region of excess metal atoms, the region being in one of a group consisting of the via, the first metal layer directly under the via, and the second metal layer directly over the via.

What is claimed is:

1. A method of making a semiconductor device having a substrate, comprising:
    forming a first interconnect layer over the substrate, wherein the first interconnect layer includes a first metal portion of a first metal type, and the first metal portion includes a first via interface location;
    forming an interlayer dielectric over the first interconnect layer;
    forming an opening in the interlayer dielectric over the first via interface location of the first metal portion;
    forming a second interconnect layer in the interlayer dielectric and over the first interconnect layer, wherein the second interconnect layer includes a second metal portion and a via of the first metal type, wherein the via is formed in the opening to form an electrical contact between the first metal portion and the second metal portion, and the via is over the first via interface location; and
    performing a first implant of the first metal type aligned to the first via interface location, wherein performing the first implant occurs after forming the second interconnect layer and forms an implanted region in the first metal portion at an interface with the via.

2. The method of claim 1, further comprising performing a second implant of the first metal type to form an implanted region in the second metal portion at a top surface of the second metal portion.

3. The method of claim 1, wherein:
    forming the second interconnect layer comprises forming a trench in the interlayer dielectric, the trench having a bottom surface;
    forming the opening comprises forming an opening from the bottom surface of the trench to the first interconnect layer;
    forming the via comprises filling the opening with copper; and
    forming the second interconnect layer comprises filling the trench with copper.

4. The method of claim 1, wherein forming the second interconnect layer comprises forming a trench in the interlayer dielectric that extends to the opening and forming copper in the opening and the trench.

5. The method of claim 1, wherein forming the second interconnect layer comprises forming a trench in the interlayer dielectric that extends to the opening and filling the trench and the extended opening with copper.

6. The method of claim 1 further comprising performing a second implant of the first metal type aligned to the first via interface location.

7. A method of making a semiconductor device having a substrate, comprising:
    forming a first interconnect layer over the substrate, wherein the first interconnect layer includes a first metal portion of a first metal type, and the first metal portion includes a first via interface location;
    forming an interlayer dielectric over the first interconnect layer;
    forming an opening in the interlayer dielectric over the first via interface location of the first metal portion;
    forming a second interconnect layer in the interlayer dielectric and over the first interconnect layer, wherein the second interconnect layer includes a second metal portion and a via of the first metal type, wherein the via is formed in the opening to form an electrical contact between the first metal portion and the second metal portion, and the via is over the first via interface location;
    after forming the second interconnect layer, performing a first implant of the first metal type aligned to the first via interface location; and
    after forming the second interconnect layer, performing a second implant of the first metal type aligned to the first via interface location, wherein the first implant forms a first implanted region and the second implant forms a second implanted region, wherein the first implanted region is in the first metal portion and the second implanted region is in the via.

8. The method of claim 6, wherein the second implant forms a second implanted region in the second metal portion.

9. The method of claim 8, further comprising performing a third implant of the first metal type aligned to the first via interface location, wherein the third implant forms a third implanted region, wherein the third implanted region is in the via.

* * * * *